United States Patent
Lin

(10) Patent No.: US 6,963,229 B2
(45) Date of Patent: Nov. 8, 2005

(54) CLOCK SKEW INDICATING APPARATUS

(75) Inventor: I-Ming Lin, Taipei (TW)

(73) Assignee: Via Technologies, Inc. (TW)

( * ) Notice: Subject to any disclaimer, the term of this patent is extended or adjusted under 35 U.S.C. 154(b) by 0 days.

(21) Appl. No.: 10/665,294

(22) Filed: Sep. 22, 2003

(65) Prior Publication Data

US 2004/0080344 A1 Apr. 29, 2004

(30) Foreign Application Priority Data

Oct. 25, 2002 (TW) .......................... 91125220 A

(51) Int. Cl.$^7$ ............................. G01R 29/02; G06F 1/04
(52) U.S. Cl. ........................................ 327/33; 327/292
(58) Field of Search ........................... 327/3, 9–10, 26, 327/33, 36–37, 40–41, 39–45, 62, 82, 89–91, 144, 170, 172, 291–294, 298, 14, 18–20, 12

(56) References Cited

U.S. PATENT DOCUMENTS

| | | | |
|---|---|---|---|
| 3,991,322 A | * | 11/1976 | Bush et al. ................... 377/61 |
| 5,264,802 A | * | 11/1993 | Beg et al. ...................... 327/3 |
| 5,313,154 A | * | 5/1994 | Norris ..................... 324/76.48 |
| 5,498,983 A | * | 3/1996 | Schoellkopf ................... 327/3 |
| 5,534,807 A | * | 7/1996 | Inada et al. ................. 327/234 |
| 6,014,042 A | * | 1/2000 | Nguyen ........................ 327/3 |
| 6,639,437 B2 | * | 10/2003 | Natsume .................... 327/144 |

FOREIGN PATENT DOCUMENTS

TW 484287 4/2002

* cited by examiner

Primary Examiner—My-Trang Nu Ton
(74) Attorney, Agent, or Firm—Rabin & Berdo, P.C.

(57) ABSTRACT

An apparatus for indicating clock skew within integrated circuits (ICs) of a system. There are first and second IC chips operating on respective clocks in the system. According to the invention, the first IC chip operating on a first clock is configured to provide the first clock as output. The second IC chip operating on a second clock has a detection circuit to receive as input the first and the second clocks and to generate a compare signal as output, where the width of the compare signal is proportional to the amount of skew between the input clocks. The second IC chip also includes a sampling circuit coupled to receive the compare signal. With the sampling circuit, an output signal indicative of skew existing between the first and the second clocks can be asserted according to the compare signal.

13 Claims, 3 Drawing Sheets

CLOCK SKEW INDICATING APPARATUS

BACKGROUND OF THE INVENTION

1. Field of the Invention

The invention relates to integrated circuit design and verification, and more particularly to an automatic clock skew indicating circuit.

2. Description of the Related Art

Advances in silicon technology have allowed designers to develop integrated circuits (ICs) with operating clock rates that were once considered unobtainable. In high-speed system design, one of the major problems is clock skew. Clock skew is the result of minor variations in the time at which clocks signals arrive at their destinations, usually IC chip clock pins. If the variations become large, then data may not be reliably clocked in and out of the IC chips. High performance systems require minimum clock skew to keep IC chips functioning properly. In practical systems, one of the critical issues is the length of clock traces on the PCB. In addition to PCB traces, cables, connectors, and chip sockets can contribute to clock skew. Moreover, even a same clock generator has pin-to-pin skew between any two outputs with identical frequency. For example, the allowable skew between clock outputs running at 100 MHz cannot exceed a maximum of 150 ps. As clock rates increase, management of clock skew becomes more susceptible to circuit design, PCB layout, and clock generator characteristics.

IC designers, system engineers, and PCB manufactures are confronted with the challenge of clock skew measurement and verification. Oscilloscopes and logic analyzer are the primary instruments used to probe any high-speed system. When attaching a test instrument to a device under test (DUT), the probe always affects the measurement in some fashion. For a timing measurement, this is directly translated into error in clock skew. It is possible to unintentionally ignore the skew problem due to improper measurement. The underlying clock skew may not be found until after the pilot run and verification procedure. Significant time and money are, however, expended. Accordingly, a way to automatically and effectively identify clock skew within high-speed ICs is required.

SUMMARY OF THE INVENTION

It is an object of the present invention to provide a mechanism to accurately indicate whether clock skew within integrated circuits (ICs) is out of a tolerable skew budget, in which these ICs are driven by a common clock source.

The present invention is generally directed to a clock skew indicating apparatus. According to one aspect of the invention, the indicating apparatus includes a detection circuit and a sampling circuit. The detection circuit receives as input first and second clocks and generates as output a compare signal, where the width of the compare signal is substantially proportional to the amount of skew between the first and the second clocks. The sampling circuit is coupled to receive the compare signal from the detection circuit. An output signal can be asserted by the sampling circuit where the compare signal is sampled at a predetermined frequency. As such, the output signal is set to indicate the amount of skew between the first and second clocks. The apparatus of the invention is preferably composed of a phase-locked loop to provide the sampling circuit with a reference clock running at the predetermined frequency.

According to another aspect of the invention, an apparatus for indicating clock skew within ICs of a system is disclosed. The system is constituted by at least two IC chips. A first IC chip operating on a first clock is configured to provide the first clock as output. A second IC chip operating on a second clock has a detection circuit to receive as input the first and the second clocks and to generate a compare signal as output, where the width of the compare signal is substantially proportional to the amount of skew between the first and the second clocks. The second IC chip also includes a sampling circuit coupled to receive the compare signal. An output signal indicative of an intolerable skew existing between the first and the second clocks can be asserted by the sampling circuit according to the compare signal. In a preferred embodiment, the first IC chip includes a control pin and an output buffer. The control pin receives an enable signal external to the first IC chip. The first clock entering the first IC chip can be sent out through the output buffer depending on the enable signal. Moreover, the second IC chip includes a phase-locked loop to provide the sampling circuit with a reference clock running at a predetermined frequency. Thus, the compare signal is sampled at the predetermined frequency and the output signal is thereby set to indicate the amount of skew between the first and the second clocks.

DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

Figure 1:
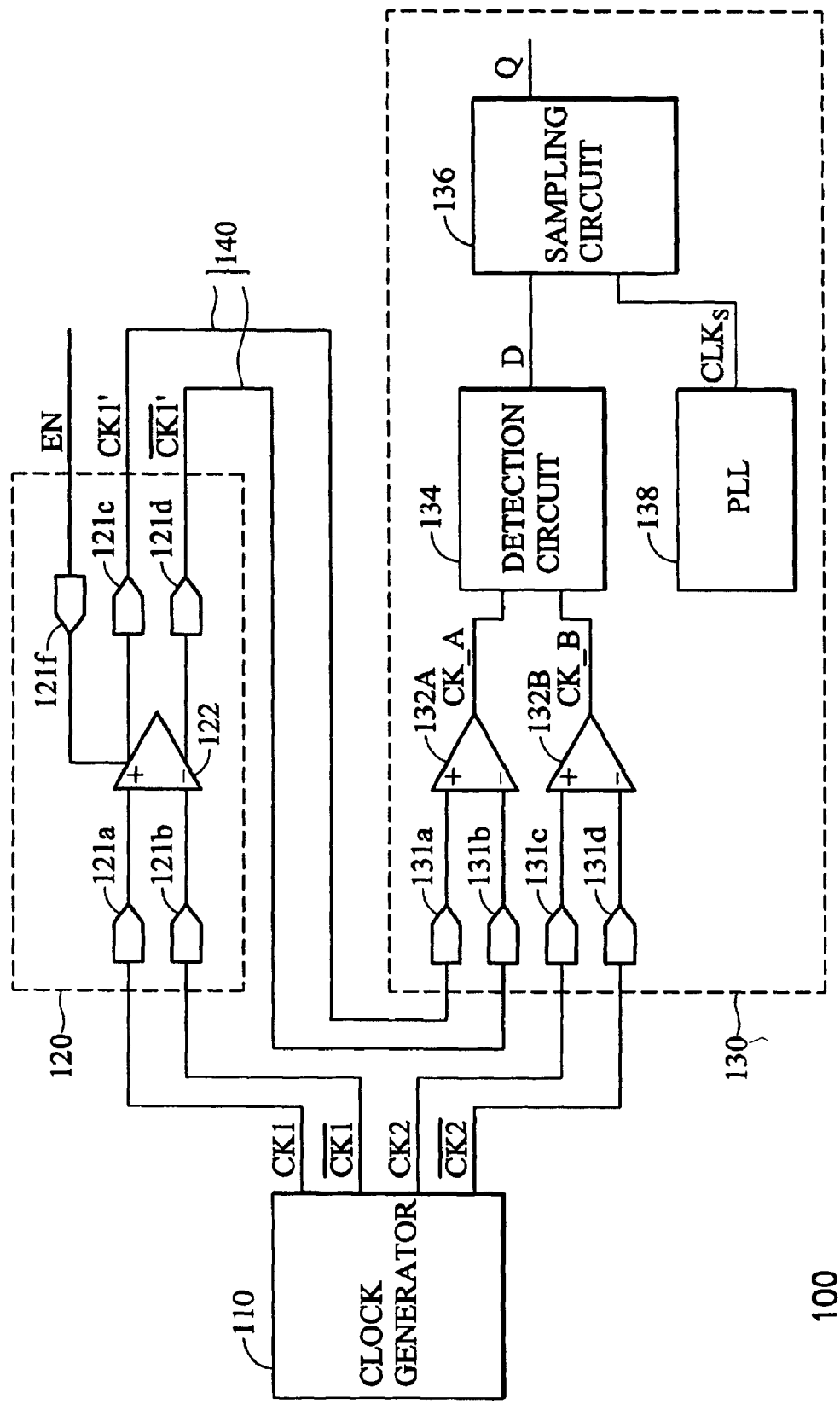
FIG. 1 is a block diagram illustrating a preferred embodiment of the invention.

Referring to FIG. 1, a high-speed system 100 is composed of a clock generator 110, IC chips 120 and 130. Assuming that the system 100 is a personal computer, for example, the IC chip 130 is representative of the North Bridge of a chipset while the IC chip 120 may be a SDRAM chip. In the preferred embodiment, the IC chips 120 and 130 are designed with a differential signaling scheme to reduce the effects of electromagnetic interference (EMI). Accordingly, the clock generator 110 separately supplies a pair of differential clocks CK1 and $\overline{CK1}$ to the IC chips 120 and another pair of differential clocks CK2 and $\overline{CK2}$ to the IC chips 130, thereby the IC chips 120 can operate on the clock pair CK1 and $\overline{CK1}$ and the IC chips 130 can operate on the clock pair CK2 and $\overline{CK2}$. The IC chip 120 includes a control pin 121$f$ and an output buffer 122. The control pin 121$f$ receives an enable signal, EN, external to the IC chip 120. The output buffer 122 receives the clock pair CK1 and $\overline{CK1}$ via input pins 121$a$ and 121$b$. At the output buffer 122, the clocks CK1 and $\overline{CK1}$ are amplified appropriately. Under control of the signal EN, the output buffer 122 is enabled to send out clocks CK1' and $\overline{CK1'}$ via output pins 121$c$ and 121$d$. Through the output buffer 122, the clock pair CK1 and $\overline{CK1}$ entering the IC chip 120 is provided to the IC chip 130 whereby clock skew within these two chips can be verified. The clock pair CK1' and $\overline{CK1'}$ are conveyed via a pair of lines 140 from the chip 120 to the chip 130 in which the line pair 140 may be a sort of test tool with a known propagation delay.

The IC chip 130 includes differential-to-single-ended converters 132A and 132B, a detection circuit 134, a sampling circuit 136, and a phase-locked loop (PLL) 138. The differential-to-single-ended converters 132A receives the clock pair CK1' and $\overline{CK1'}$ via inputs 131a and 131b, while the differential-to-single-ended converters 132B receives the clock pair CK2 and $\overline{CK2}$ via inputs 131c and 131d. Using the converters 132A and 132B, the detection circuit 134 is provided with a version of differential clock pairs converted into a single-ended signaling scheme. It should be appreciated in the art that the converters 132A and 132B can be excluded if the IC chips 120 and 130 are directly designed with the single-ended signaling scheme. The detection circuit 134 receives as input single-ended clocks CLK_A and CLK_B and generates as output a compare signal, D. According to the invention, the detection circuit 134 may be a comparator and the width of the signal D is substantially proportional or equal to the amount of skew between the clocks CLK_A and CLK_B. The PLL 138 provides the sampling circuit 136 with a reference clock $CLK_s$ running at a predetermined frequency. The compare signal D is then fed to the sampling circuit 136 where the signal D is sampled at the predetermined frequency. Note that the predetermined frequency is designed to detect clock skew just over the allowable value of the high-speed system 100. An output signal, Q, which indicates an intolerable skew existing between the clocks CLK_A and CLK_B, can be asserted by the sampling circuit 136 according to the compare signal D. In the preferred embodiment, the sampling circuit 136 is representative of a latch.

Figure 2:
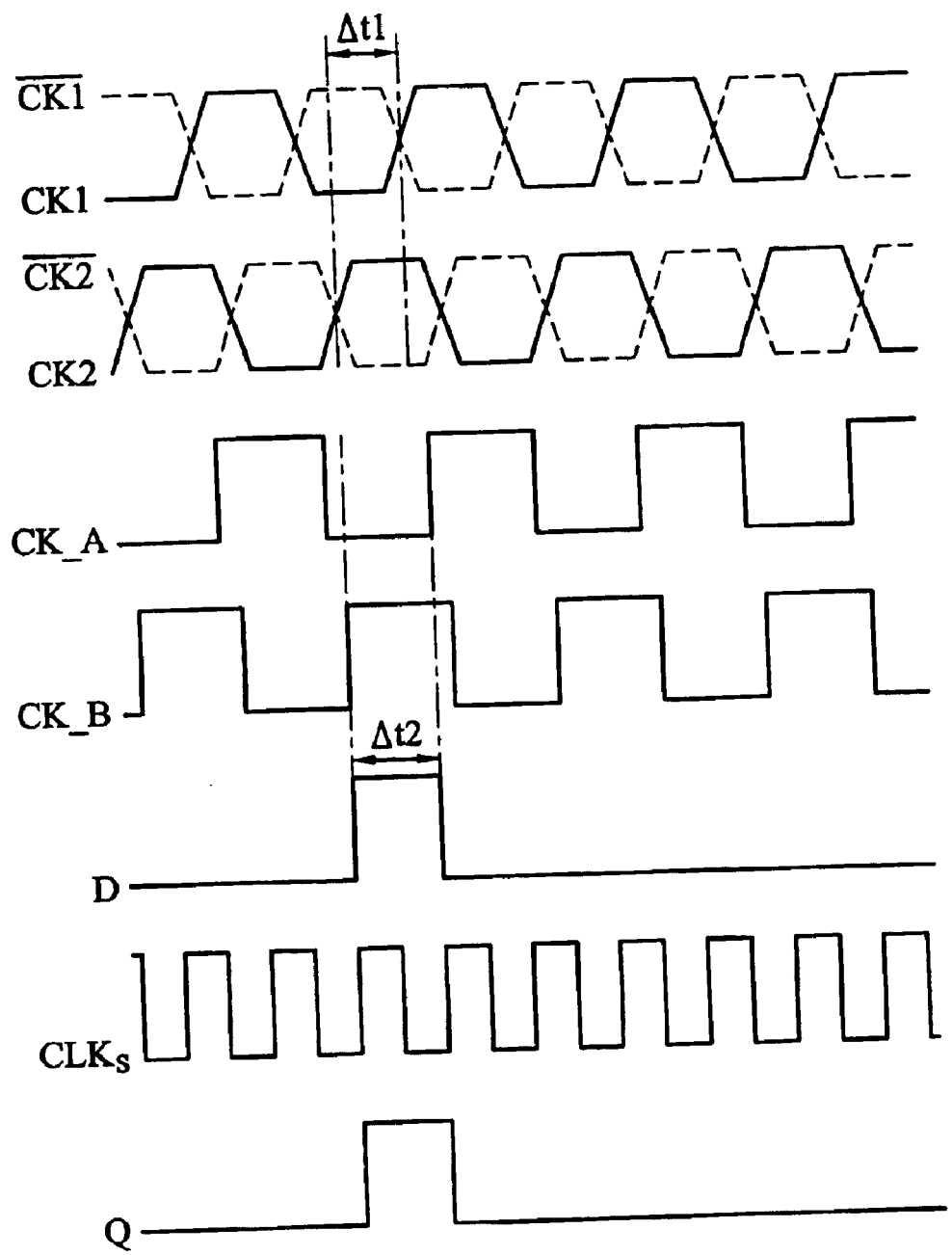
FIG. 2 is a timing diagram of the preferred embodiment in accordance with the invention.

Referring to FIG. 2, it is shown that the amount of skew between the clock pair CK1, $\overline{CK1}$ and the clock pair CK2, $\overline{CK2}$ is $\Delta t1$. This incurs the clock CLK_A lagging behind the clock CLK_B by a time $\Delta t2$ at the detection circuit 134. As depicted, a compare signal D of width $\Delta t2$ is thus generated. If skew between the clocks CLK_A and CLK_B is less than the allowable value of the system 100, then the compare signal D cannot be sampled so the output signal Q is not asserted by the sampling circuit 136; otherwise, the compare signal D is sampled by the clock $CLK_s$ running at the predetermined frequency. As show in FIG. 2, the output signal Q indicative of the amount of skew between the clocks CLK_A and CLK_B is asserted by the sampling circuit 136. Since the propagation delay has been known in advance, the output signal Q virtually indicates the actual skew between the clock pair CK1, $\overline{CK1}$ and the clock pair CK2, and $\overline{CK2}$.

Figure 3A:
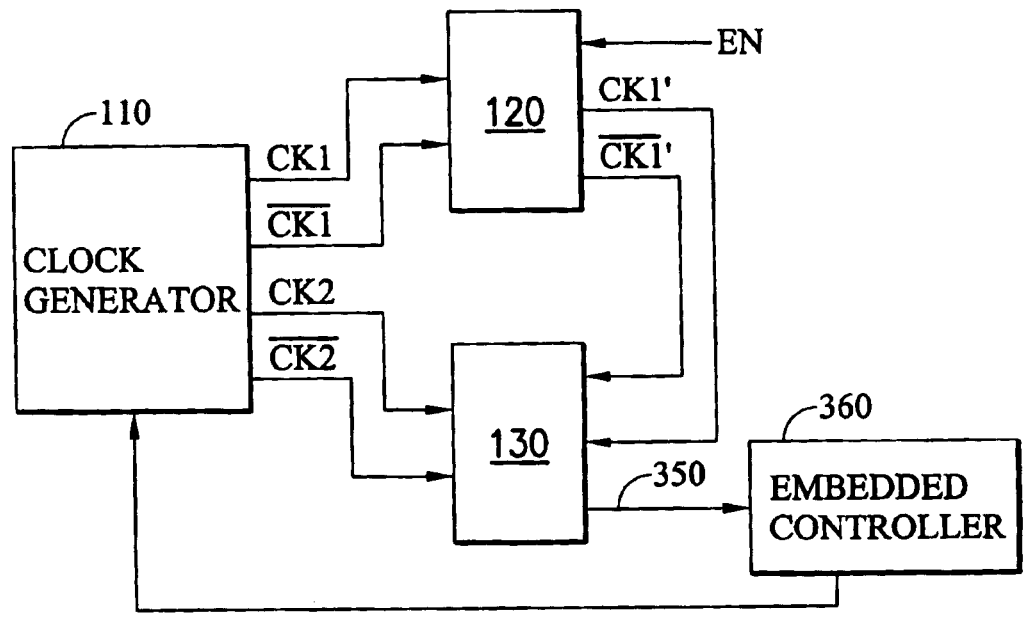
FIGS. 3A and 3B are block diagrams illustrating two applications in accordance with the invention.
Figure 3B:
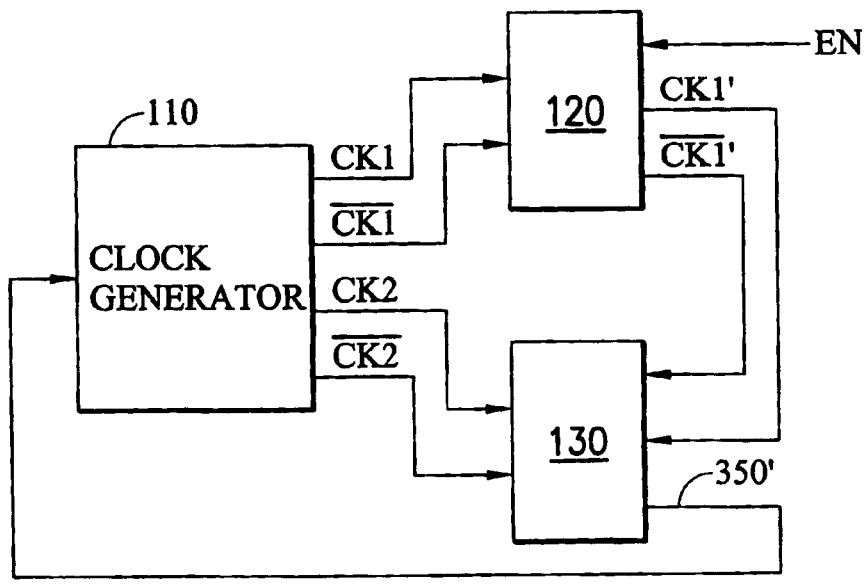

According to the invention, the output signal Q is written to a register (not shown) of the IC chip 130. When clock skew is measured, the enable signal EN is set to "1" which allows the IC chip 120 to output the clock pair, CK1' and $\overline{CK1'}$, going through itself for verification. Referring now to FIG. 3A, it is assumed that the high-speed system 100 represents a notebook computer motherboard. To evaluate clock skew within the IC chips 120 and 130, an embedded controller 360 is employed to read the quantity of the signal Q from the register of the IC chip 130. Note that the embedded controller 360 is programmed to communicate with the clock generator 110 via an interface 350. Referring to FIG. 3B, the IC chip 130 provides the quantity of the signal Q in its register as feedback to the clock generator 110 via an interface 350'. In this manner, the clock generator 110 is adjusted to reduce skew between its outputs. As depicted, the IC chip 130 communicates directly with the clock generator 110 because desktop computers may not include the embedded controller 360 in the future.

In view of the above, the present invention discloses a scheme to accurately indicate whether clock skew within ICs is out of a tolerable skew budget, in which these ICs are driven by a common clock source. With the help of the invention, intolerable clock skew can be detected in the early stage and a reduction in time-to-market is achieved accordingly. The product development time and cost will be far less than the traditional way.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock skew indicating apparatus comprising:
    a detection circuit for receiving as input first and second clocks and generating as output a compare signal, wherein said first clock is transmitted with a differential signaling scheme;
    a sampling circuit, according to said compare signal, for asserting an output signal indicative of skew existing between said first and said second clocks, wherein said output signal is set to indicate an amount of skew between said first and said second clocks; and
    a first differential-to-single-ended converter receiving said first clock, for providing said detection circuit with a version of said first clock converted into a single-ended signaling scheme.

2. The apparatus as recited in claim 1 wherein said second clock is transmitted with the differential signaling scheme.

3. The apparatus as recited in claim 2 further comprising a second differential-to-single-ended converter receiving said second clock, for providing said detection circuit with a version of said second clock converted into the single-ended signaling scheme.

4. The apparatus as recited in claim 1 wherein the width of said compare signal generated by said detection circuit is substantially proportional to the amount of said skew between said first and said second clocks.

5. The apparatus as recited in claim 4 wherein said sampling circuit samples said compare signal at a predetermined frequency such that said output signal is set to indicate the amount of said skew between said first and said second clocks.

6. The apparatus as recited in claim 5 further comprising a phase-locked loop for providing said sampling circuit with a reference clock running at said predetermined frequency.

7. An apparatus for indicating clock skew within integrated circuits (ICs) of a system, comprising:
    a first IC chip operating on a first clock and providing as output said first clock, comprising:
        a control pin receiving an enable signal external to said first IC chip; and
        an output buffer coupled to receive said first clock, for outputting said first clock under control of said enable signal; and
    a second IC chip operating on a second clock, comprising:
        a detection circuit for receiving as input said first and said second clocks and generating as output a compare signal; and
        a sampling circuit, according to said compare signal, for asserting an output signal indicative of skew existing between said first and said second clocks;
        wherein the width of said compare signal is substantially proportional to an amount of said skew between said first and said second clocks, and said output signal is set to indicate an amount of skew between said first and second clocks.

8. The apparatus as recited in claim 7 wherein said first clock is transmitted with a differential signaling scheme.

9. The apparatus as recited in claim 7 wherein said sampling circuit samples said compare signal at a predetermined frequency such that said output signal is set to indicate the amount of said skew between said first and said second clocks.

10. The apparatus as recited in claim 9 wherein said second IC chip comprises a phase-locked loop for providing said sampling circuit with a reference clock running at said predetermined frequency.

11. An apparatus for indicating clock skew within integrated circuits (ICs) of a system, comprising:

a first IC chip operating on a first clock and providing as output said first clock, wherein said first clock is transmitted with a differential signaling scheme; and a second IC chin operating on a second clock, comprising:
  a detection circuit for receiving as input said first and said second clocks and generating as output a compare signal; and a sampling circuit, according to said compare signal, for asserting an output signal indicative of skew existing between said first and said second clocks;

wherein the width of said compare signal is substantially proportional to an amount of said skew between said first and said second clocks, and said output signal is set to indicate an amount of skew between said first and second clocks; and wherein said second IC chip further comprises a first differential-to-single-ended converter receiving said first clock, for providing said detection circuit with a version of said first clock converted into a single-ended signaling scheme.

12. The apparatus as recited in claim 11 wherein said second clock is transmitted with the differential signaling scheme.

13. The apparatus as recited in claim 12 wherein said second IC chip further comprises a second differential-to-single-ended converter receiving said second clock, for providing said detection circuit with a version of said second clock converted into the single-ended signaling scheme.

* * * * *